United States Patent [19]
Ishii

[11] Patent Number: 5,334,540
[45] Date of Patent: Aug. 2, 1994

[54] OBIC OBSERVATION METHOD AND APPARATUS THEREFOR

[75] Inventor: Tatsuya Ishii, Itami, Japan

[73] Assignee: Mitsubishi Denki Kabushiki Kaisha, Tokyo, Japan

[21] Appl. No.: 56,908

[22] Filed: May 5, 1993

Related U.S. Application Data

[63] Continuation-in-part of Ser. No. 896,312, Jun. 10, 1992, abandoned.

[30] Foreign Application Priority Data

Nov. 14, 1991 [JP] Japan .................. 3-298631

[51] Int. Cl.$^5$ .................................. H01L 21/00
[52] U.S. Cl. ................................. 437/7; 437/8; 324/765; 324/767
[58] Field of Search ............ 324/158 T, 158 R; 437/7, 8

[56] References Cited

U.S. PATENT DOCUMENTS

| | | | |
|---|---|---|---|
| 4,588,950 | 5/1986 | Henley | 324/158 T |
| 4,698,587 | 10/1987 | Burns et al. | 324/158 T |
| 4,721,910 | 1/1988 | Bokor et al. | 324/158 T |
| 4,761,607 | 8/1988 | Shiragasawa et al. | 324/158 R |
| 4,851,768 | 7/1989 | Yoshizawa et al. | 324/158 T |
| 4,950,897 | 8/1990 | Mandelis et al. | 324/158 R |
| 4,956,603 | 9/1990 | Russo | 324/158 T |

OTHER PUBLICATIONS

IEEE/IRPS, pp. 118-121, 1983, D. J. Burns, et al., "Imaging Latch-Up Sites in LSI CMOS with a Laser Photoscanner".

Failure Analysis of Multilevel Metalized LSI Using Optical Beam Induced Current, J. Mitsuhashi, S. Komori and N. Tsubouchi, LSI Laboratory, Mitsubishi Electric Corporation, 4-1 Mizuhara, Itami City, Hyoto, 664 Japan, Oct. 1991.

*Primary Examiner*—Brian E. Hearn
*Assistant Examiner*—Kevin M. Picardat
*Attorney, Agent, or Firm*—Oblon, Spivak, McClelland, Maier & Neustadt

[57] ABSTRACT

In order to enable OBIC observation of a high density silicon semiconductor device provided on a semiconductor chip whose surface is mostly covered with a metal wire, i.e., for measurement of an OBIC current, the silicon semiconductor device is irradiated with a light beam from a rear surface side thereof. The wavelength of the light beam to be used has a light penetration depth, i.e., a depth for allowing light absorption of silicon (depth allowing penetration of light required for generating a photovoltaic effect) that is larger than the thickness of the silicon chip, and is shorter than the absorption edge of silicon. For example, a YAG laser beam of 1064 nm in wavelength or an InGaAs laser beam of 980 nm in wavelength is used as the light beam.

13 Claims, 6 Drawing Sheets

OBIC OBSERVATION METHOD AND APPARATUS THEREFOR

The present application is a continuation-in-part of U.S. application Ser. No. 07/896,312, filed Jun. 10, 1992 now abandoned.

BACKGROUND OF THE INVENTION

1. Field of the Invention

The present invention relates to a test failure analysis technique for a semiconductor device, and more particularly, it relates to an OBIC (Optical Beam Induced Conductivity) observation technique.

2. Description of the Background Art

In order to improve the fabrication yield and the quality of a semiconductor device, it is requisite to carry out failure analysis of a product which is decided as defective in various tests during and after fabrication steps. A general technique of such failure analysis is as follows:

First, a point on a semiconductor chip causing a failure is found by electrical analysis. Then, a wiring metal, an interlayer isolation film or the like is removed by etching and a sectional hole is formed by a focused ion beam, to observe the point causing the failure with an electron microscope or the like. Thus, the cause of the failure is discovered. In relation to a recent semiconductor device which is complicated and highly densified, it is particularly important to find a portion causing a failure by the first step of electrical analysis. While such electrical analysis may be carried out by various techniques, the present invention relates to the so-called OBIC observation technique of detecting an OBIC current which is generated upon application of a light beam to a p-n junction in a semiconductor device and observing a defect and voltage distribution of the p-n junction.

FIG. 6 shows an exemplary OBIC observation method in relation to a sample of a CMOS inverter, whose chip is illustrated in section. The method shown in FIG. 6 is adapted to observe voltage distribution in a p-n junction.

The operation of the CMOS inverter shown in FIG. 5 is now described, in relation to generation of an OBIC current.

Referring to FIG. 6, a CMOS structure is defined by an n-channel MIS transistor which is formed by an n-type impurity diffusion layer 3a serving as a drain electrode, an n-type impurity diffusion layer 3b serving as a source electrode and a gate electrode 5a connected onto a portion of a p-type silicon substrate 1 between the drain and source electrodes through a gate dielectric film 9 and a p-channel transistor which is formed by a p-type impurity diffusion layer 4b serving as a drain electrode, a p-type impurity diffusion layer 4c serving as a source electrode and a gate electrode 5b connected onto a portion of an n-type well 1a between the drain and source electrodes through the gate dielectric film 9 on the n-type well 1a. The gate electrodes 5a and 5b are connected to an input terminal Vin in common, while the n-type and p-type impurity diffusion layers 3a and 4c are connected to an output terminal Vout in common. The p-type silicon substrate 1 is grounded through the p-type impurity diffusion layer 3c and a metal wire 13, while the n-type impurity diffusion layer 3b serving as a source electrode is also grounded through the metal wire 13. On the other hand, the n-type well 1a is connected to a power source 6 through the n-type impurity diffusion layer 4a and the metal wire 13, while the p-type impurity diffusion layer 4b serving as a drain electrode is also connected to the power source 6 through the metal wire 13.

When a negative voltage is applied to the input terminal Vin, the p-channel MIS transistor conducts so that a source voltage appears at the output terminal Vout. The n-channel MIS transistor is in an open state. In this state, therefore, a p-n junction between the n-type impurity diffusion layer 3a and the p-type silicon substrate 1 is reverse-biased to generate a high electric field.

When a light beam 10 is applied to this portion from a generally employed HeNe laser of 633 nm in wavelength, for example, pairs of electrons 11 and holes 12 are generated by a photovoltaic effect, as shown in FIG. 6. The holes 12 form an OBIC current, which in turn flows into the silicon substrate 1, and further flows into the ground through the p-type impurity diffusion layer 3c. This OBIC current is detected by an ammeter 7.

The OBIC current, which is thus generated by a photovoltaic effect, flows in a large amount since larger amounts of pairs of electrons 11 and holes 12 are formed in the p-n junction which is reverse-biased to generate a high electric field as compared with a non-biased p-n junction between the n-type impurity diffusion layer 3b and the silicon substrate 1, for example, irradiated with the light beam 10. Therefore, it is possible to recognize voltage distribution of the p-n junction by scanning the light beam 10 with respect to the surface of the semiconductor chip from the value of the OBIC current in the region irradiated with the light beam 10. This technique is briefly described in IEEE 21st Annual Proc. Rel. Phy., p. 118 (1983) by Daniel J. Burns et al., for example.

In the conventional OBIC observation technique, the light beam 10 cannot be applied to nor observed in a region of a p-n junction covered with the metal wire 13 of aluminum etc., such as the p-type impurity diffusion layer 4c shown in FIG. 6, for example, since the light beam 10 is applied from the side of a surface of the semiconductor chip which is provided with the device. In particular, a recent mass storage memory which is highly densified with a multilayered metal wire has substantially no region allowing detection of an OBIC current, and cannot be subjected to the test and analysis by this technique.

SUMMARY OF THE INVENTION

The OBIC observation method according to the present invention comprises the steps of: (a) applying a light beam to a silicon substrate, having a first major surface being provided with a p-n junction and a second major surface being opposite to the first major surface, from the second major surface side while performing prescribed scanning, (b) detecting an OBIC current fed by electron-hole pairs being excited by the light beam due to a photovoltaic effect in the p-n junction, and (c) displaying distribution of the OBIC current in the silicon substrate in correspondence to the prescribed scanning. The light beam has a wavelength implementing a light penetration depth which is larger than the thickness of the silicon substrate. The wavelength of the light beam is shorter than the absorption edge of the silicon substrate.

Preferably the light beam is a YAG ($Y_3Al_5O_{12}$: yttrium aluminum garnet) laser beam of 1064 nm in wavelength, or an InGaAs (indium gallium arsenide) laser beam of 980 nm in wavelength.

The OBIC observation apparatus according to the present invention comprises light emitting means for applying a light beam having a prescribed wavelength, light introducing means for introducing the light beam into a silicon substrate, having a first major surface being provided with a p-n junction and a second major surface being opposite to the first major surface, from the second major surface side, scanning means for performing prescribed scanning of the light beam with respect to the silicon substrate, means for detecting an OBIC current fed by electron-hole pairs being excited by the light beam in the pn junction due to a photovoltaic effect, and means for displaying distribution of the OBIC current in the silicon substrate in correspondence to the prescribed scanning.

The wavelength is preferably such a wavelength which attains a greater light penetration depth than the thickness of the silicon substrate and is shorter than the absorption edge of the silicon substrate.

Preferably the light emitting means is a YAG ($Y_3Al_5O_{12}$): yttrium aluminum garnet) laser oscillator of 1064 nm in wavelength, or an InGaAs (indium gallium arsenide) laser oscillator of 980 nm in wavelength.

The OBIC observation method according to the present invention is adapted to apply the light beam, having a wavelength implementing a light penetration depth which is larger than the thickness of the silicon substrate, from the rear surface side of the semiconductor chip, thereby enabling OBIC observation of the p-n junction under a metal wire.

Throughout the specification, the term "light penetration depth" indicates a depth of penetration of light which is necessary for generating a photovoltaic effect in silicon. The term "absorption edge" refers to a wavelength which corresponds to band gap energy of silicon.

According to the present invention, the laser beam to be applied to the rear surface of the silicon chip for observation of the OBIC current is such a laser beam which implements a light penetration depth larger than the thickness of the silicon substrate and which is shorter than the absorption edge of the silicon substrate. For example, a YAG laser of a wavelength of 1064 nm or an InGaAs laser beam of a wavelength of 980 nm is used. Hence, OBIC observation of a p-n junction covered with a metal wire, which has been heretofore impossible, is possible. Thus, the present invention is remarkably useful with respect to a test or failure analysis of a recent high density device in which the surface of a semiconductor chip is mostly covered with a metal wire.

The present invention has been proposed in order to solve the aforementioned problem, and an object thereof is to provide a method of and an apparatus for applying a light beam to a semiconductor chip from its rear surface side for allowing OBIC observation of a p-n junction region over the entire surface of the chip without depending on a metal wire.

The foregoing and other objects, features, aspects and advantages of the present invention will become more apparent from the following description of the present invention when taken in conjunction with the accompanying drawings.

DESCRIPTION OF THE PREFERRED EMBODIMENTS

Figure 1:
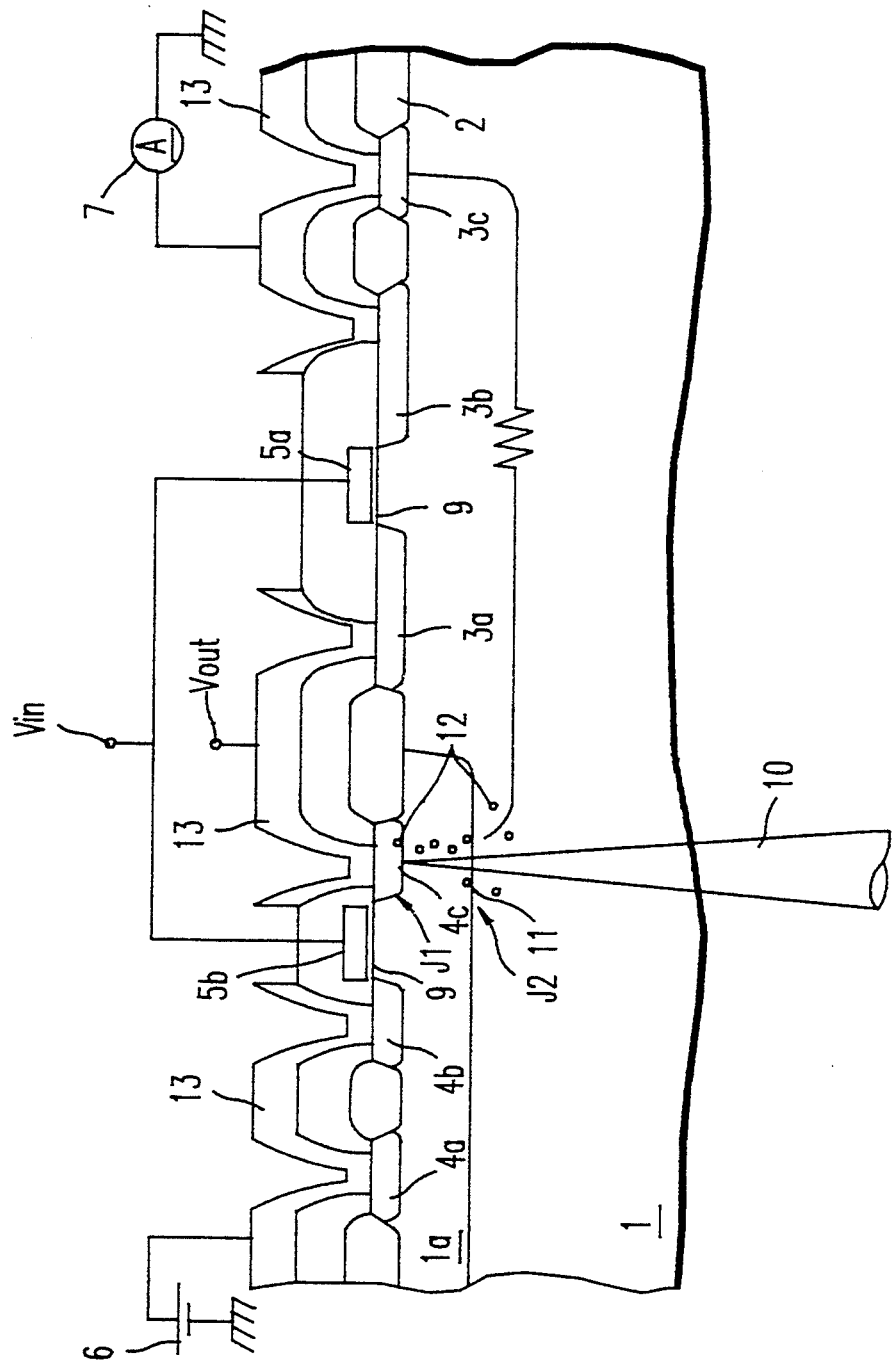
FIG. 1 is a sectional view showing a silicon chip according to a first embodiment of the present invention.
Figure 6:
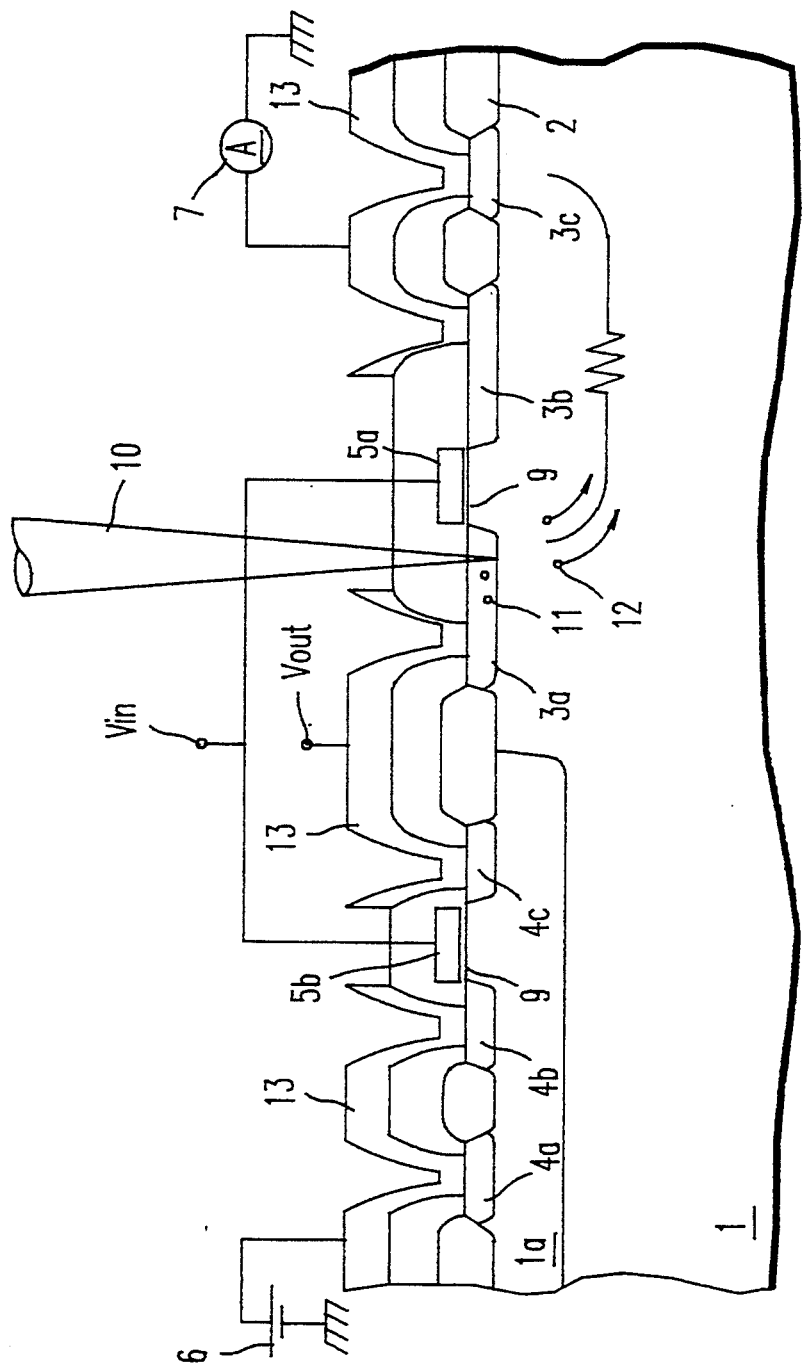
FIG. 6 is a sectional view showing the structure of a silicon chip according to the prior art.

FIG. 1 schematically shows an OBIC observation method according to a first embodiment of the present invention. The sectional structure of a chip shown in FIG. 1 is identical to that of the CMOS inverter shown in FIG. 6. This CMOS inverter is formed by an n-channel MIS transistor and a p-channel MIS transistor.

The n-channel MIS transistor is formed by an n-type impurity diffusion layer 3a serving as a drain electrode, an n-type impurity diffusion layer 3b serving as a source electrode and a gate electrode 5a connected onto a portion of a p-type silicon substrate 1 between the drain and source electrodes through a gate dielectric film 9, which are arranged in a region enclosed by an oxide isolation film 2 formed by a LOCOS method on the surface of the p-type silicon substrate 1. On the other hand, the p-channel transistor, which is provided on an n-type well 1a formed on the p-type semiconductor substrate 1, is formed by a p-type impurity diffusion layer 4b serving as a drain electrode, a p-type impurity diffusion layer 4c serving as a source electrode and a gate electrode 5b connected onto a portion of the n-type well 1a between the drain and source electrodes through the gate dielectric film 9, which are arranged in a region enclosed by the oxide isolation film 2 formed by the LOCOS method.

The gate electrodes 5a and 5b are connected to an input terminal Vin in common, while the n-type and p-type impurity diffusion layers 3a and 4c are connected to an output terminal Vout in common. The p-type silicon substrate 1 is grounded through the p-type impurity diffusion layer 3c, while the n-type impurity diffusion layer 3b serving as a source electrode is also connected to the same. On the other hand, the n-type well 1a is connected through the n-type impurity diffusion layer 4a to a power source 6, to which the p-type impurity diffusion layer 4b serving as a drain electrode is also connected. The thickness of the silicon chip is 500 μm.

Suppose that a positive voltage is applied to the input terminal Vin. In this case, the n-channel MIS transistor conducts so that the output terminal Vout is at a ground potential. The p-channel MIS transistor is in an open state. In this state, therefore, a p-n junction J1 between the p-type impurity diffusion layer 4c and the n-type well 1a is reverse-biased to generate a high electric field. When a light beam 10 is applied to this portion from the rear side of the silicon chip as shown in FIG. 1, it is possible to form pairs of electrons 11 and holes 12 by a photovoltaic effect, thereby enabling OBIC observation.

In order to thus deliver light which is required for generating a photovoltaic effect in a p-n junction which is formed in the vicinity of a silicon chip surface from the rear surface side of the silicon chip, it is necessary to select a light beam having a light penetration depth which is larger than the thickness of the silicon chip.

Figure 2:
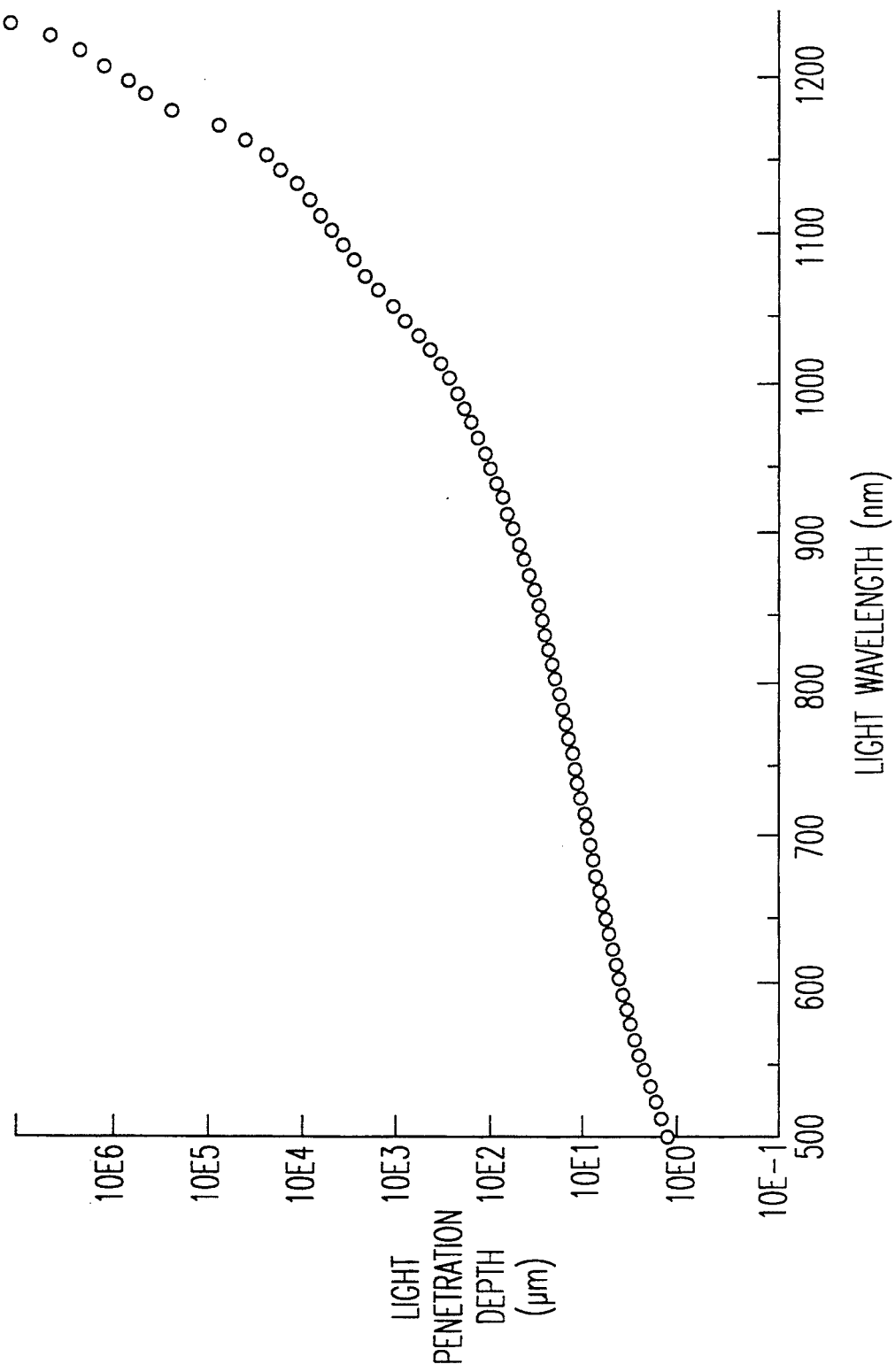
FIG. 2 is a graph showing wavelength dependency of a light penetration depth.

FIG. 2 is a graph plotting wavelengths of light and light penetration depths in silicon. It is understood from FIG. 2 that the required wavelength is lengthened as the thickness of silicon is increased.

In general, the silicon chip has a thickness of 100 μm or more. In such a silicon chip, use of an HeNe laser of a wavelength of 633 nm as the light beam 10, for instance, which is popular in the art, would not generate photoelectromotive force in a p-n junction which is formed in the vicinity of the silicon chip surface since the light penetration depth of the light beam 10 is smaller than 100 μm. On the other hand, an InGaAs laser of a wavelength of 980 nm, a YAG laser of a wavelength of 1064 nm or an HeNe laser of a wavelength of 1152 nm, having a light penetration depth of more than 100 μm, generates photoelectromotive force even in the vicinity of the surface of the silicon chip.

Figure 3A:
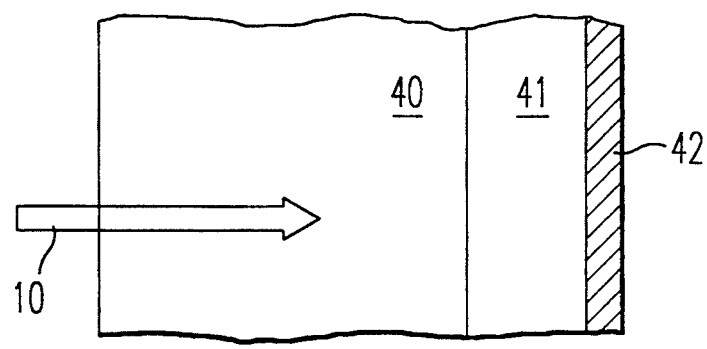
FIGS. 3A to 3C illustrate states of penetration of light beams 10 in silicon.
Figure 3B:
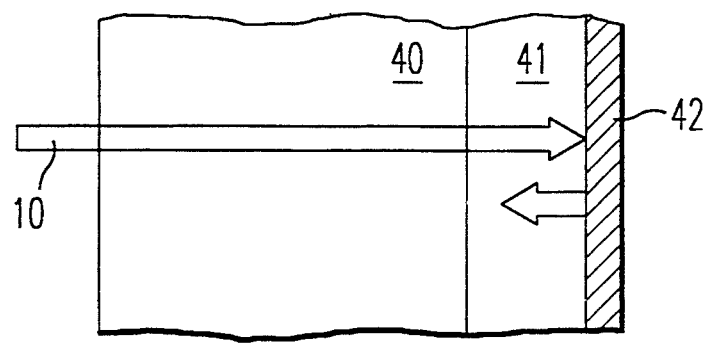
Figure 3C:
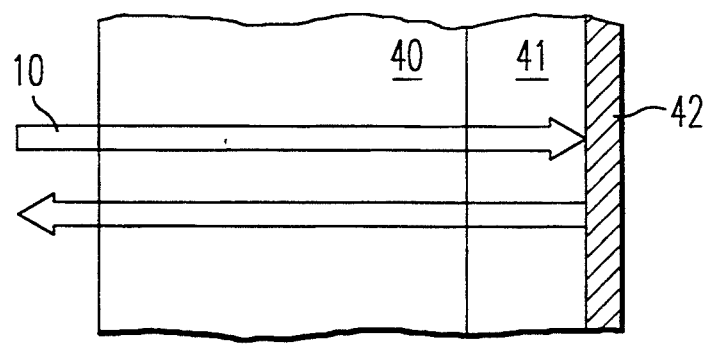

FIGS. 3A to 3C typically illustrate this. In each figure, a diffusion region 41 of p-n junction is formed on one major surface of a silicon substrate 40, and an aluminum wire 42 is formed to cover the same. A light beam 10 is applied from another major surface side.

When the light penetration depth is small, the light beam 10 cannot reach the diffusion region 41 as shown in FIG. 3A, to allow no OBIC observation. When the light beam 10 has a light penetration depth which is larger than the thickness of the silicon substrate 40, the light beam 10 passes through the diffusion region 41 to be reflected by the aluminum wire 42, and returns to the diffusion region 41 again, as shown in FIG. 3B. When the light beam 10 has a further larger wavelength, the light beam 10 passes through the silicon substrate 40 as shown in FIG. 3C. Thus, it is unpreferable to employ the light beam 10 having an excess wavelength for OBIC observation. In each case of FIGS. 3B and 3C, however, it is possible to attain a reinforcing effect due to reflection of the light beam 10 by the aluminum wire 42, by applying the light beam 10 from the side of the major surface which is opposite to that provided with the diffusion region 41 and the aluminum wire 42.

However, to attain an improved defect detection sensitivity, not only the light penetration depth of an irradiation laser but also energy which corresponds to the wavelength of the irradiation laser must be considered. This is because irradiation of a laser light having a longer wavelength than a wavelength which corresponds to the band gap energy of the silicon chip (i.e., absorption edge of the silicon chip) will result in insufficient detection of the OBIC current. This is problematic particularly when the design rule is small because of fine features in an integrated circuit since the smaller the design rule is, the smaller the quantity of the OBIC current is, and hence, the less accurate the defect detection is.

Figure 4:
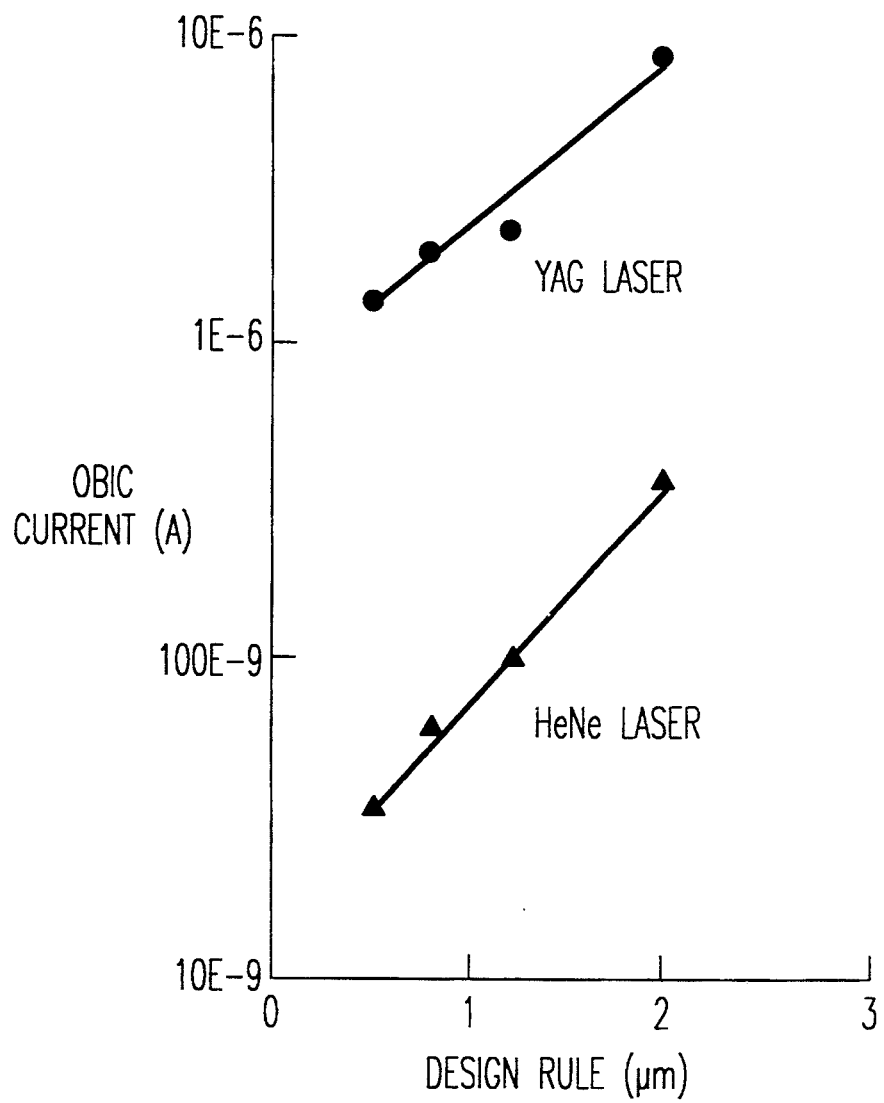
FIG. 4 is a graph showing a dependence of an OBIC current on the design rule.

FIG. 4 is a graph showing a dependence of the OBIC current on the design rule. When an HeNe laser of a wavelength of 1152 nm is used, the OBIC current is less than 0.1 μA when the design rule is 1 μm, which indicates unsatisfactory detection of a defect.

On the other hand, as also shown in FIG. 4, use a YAG laser of a wavelength of 1064 nm attains about a thirty fold increase in the generated OBIC current as compared with where an HeNe laser of a wavelength of 1152 nm is used. As is well known, the band gap energy of a silicon chip is 1.106 eV, that is, 1121 nm in absorption edge. Having a wavelength shorter than this, the YAG laser possesses larger energy than the band gap energy of the silicon chip. Hence, by using the YAG laser, greater photovoltaic effect is achieved in the silicon chip, and therefore, the detection sensitivity is enhanced. Similarly, an InGaAs laser of a wavelength of 980 nm is also preferred to an HeNe laser of a wavelength of 1152 nm.

Figure 5:
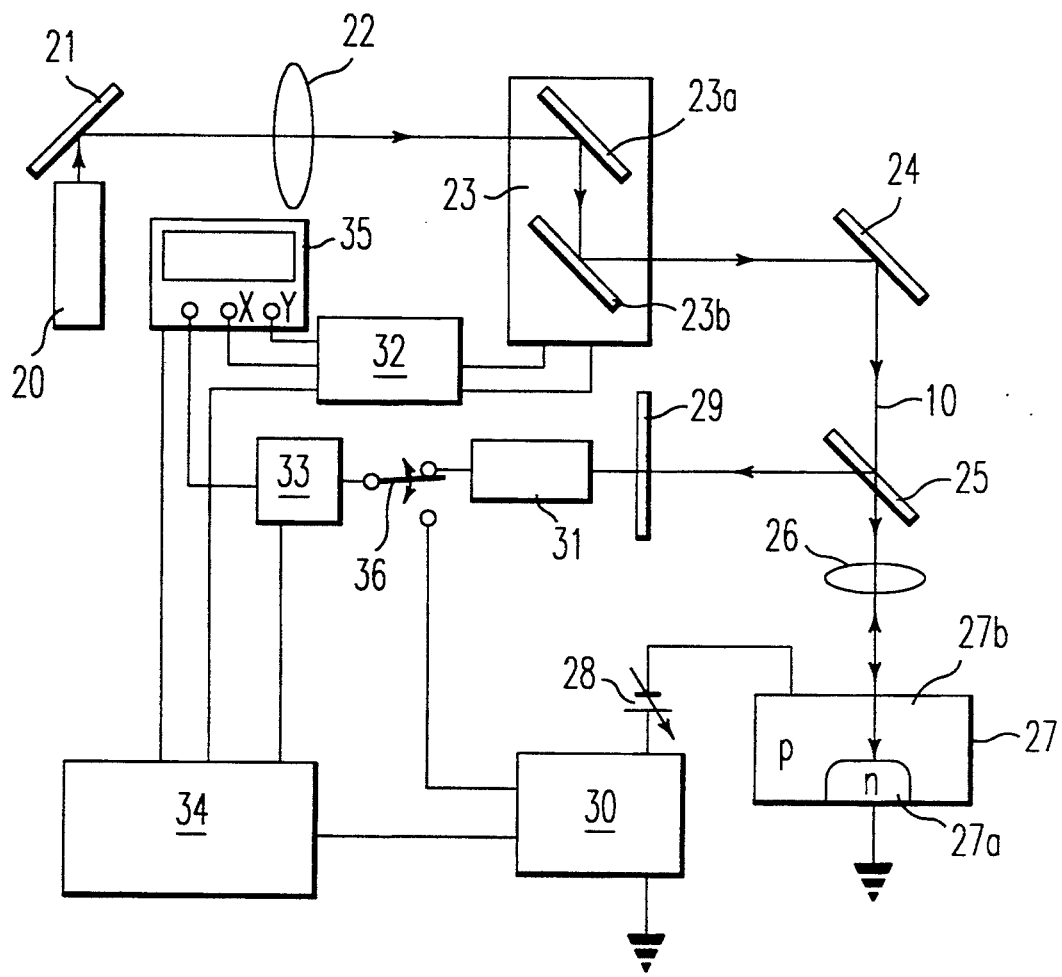
FIG. 5 is a block diagram showing an OBIC current observation apparatus according to a second embodiment of the present invention.

FIG. 5 is a block diagram showing an OBIC observation apparatus according to a second embodiment of the present invention. An OBIC current amplifier 30 is connected to a semiconductor device 27 to be OBIC-observed, to apply a bias voltage 28 at need. Even if this bias voltage 28 is not applied, it is possible to observe an OBIC current since a voltage caused by a diffusion potential is applied to a p-n junction.

A laser source 20 is selected from the above-mentioned lasers. A light beam 10 emitted from the laser source 20 passes through a reflecting mirror 21, a lens 22, an X-Y scanner unit 23, a reflecting mirror 24, a translucent mirror 25 and an objective lens 26, to reach a rear surface 27b of the semiconductor device 27.

The X-Y scanner unit 23 is provided with an X-direction scanning mirror 23a and a Y-direction scanning mirror 23a, which scans the light beam 10 in X and Y directions respectively. A control computer 34 controls the scanning timing etc. through an interface circuit 32.

The light beam 10 is applied to a portion close to a surface 27a through the rear surface 27b of the semiconductor device 27, while being scanned in the X and Y directions. The as-obtained OBIC current is amplified in the OBIC current amplifier 30 according to the control computer 34, and supplied to a CRT display 35 through a video amplifier 33. The video amplifier 33 and the X and Y direction scanning mirrors 23a and 23b are synchronized with each other by the control computer 34, so that the CRT display 35 displays distribution of the OBIC current, i.e., voltage distribution.

The video amplifier 33 also receives an optical image of the rear surface 27b of the semiconductor device 27, which image is obtained by reflected light of the light beam 10, through a switch 36. In this case, the light beam 10 reflected by the rear surface 27b of the semiconductor device 27 is further reflected by the translucent mirror 25, photoelectrically converted by a reflected light photomultiplier 31 through a filter 29, and transmitted to the video amplifier 33 through the switch 36. The optical image is previously stored in the CRT display 35 in advance of the OBIC observation, so that the voltage distribution obtained later can be displayed in a state overlapped with this.

Referring again to FIG. 1, the light beam 10 is also applied to another p-n junction J2 between the n-type well 1a and the p-type silicon substrate 1, whereby pairs of electrons 11 and holes 12 are formed also in this portion. Thus, the electrons 11 formed in the p-n junction J2 are present in the n-type well 1a in addition to those formed in the p-n junction J1, whereby excess electrons 11 are provided in the n-type well 1a. It is conceivable that the potential of the n-type well 1a is reduced by the excess electrons 11 and the electric field across the n-type well 1a and the p-type silicon substrate 1 is weakened, to reduce the number of the holes 12 formed in the p-n junction J1. Thus, the holes 12 form an OBIC current, which in turn flows into the silicon substrate 1 to be detected by an ammeter 7 through the grounded p-type impurity diffusion layer 3c, while the OBIC current is reduced as compared with a case of applying the light beam 10 to a non-biased p-n junction part such as that between the p-type impurity diffusion layer 4b and the n-type well 1a, for example.

Such reduction of the required OBIC current resulting from photovoltaic effects caused in a plurality of p-n junctions by the light beam 10 occurs also when the light beam 10 is applied from the surface side of the silicon chip as in the conventional case. However, application of the present invention is not disabled by this.

Also when the light beam is applied from the rear surface side of the semiconductor chip as described above, it is possible to recognize voltage distribution of the p-n junction from the value of the OBIC current. Further, it is possible to perform OBIC observation in regions of the semiconductor chip surface covered with a metal, such as the n-type impurity layer 4a and the p-type impurity diffusion layers 4b and 4c shown in FIG. 1, for example, which observation has been impossible in the prior art.

While the invention has been shown and described in detail, the foregoing description is in all aspects illustrative and not restrictive. It is therefore understood that numerous modifications and variations can be devised without departing from the scope of the invention.

What is claimed and new and desired to be secured by Letters Patent of the United States is:

1. An OBIC observation method comprising the steps of:
   (a) applying a light beam to a silicon substrate, having a first major surface being provided with a p-n junction and a second major surface opposite to said first major surface, from the side of said second major surface while performing prescribed scanning;
   (b) detecting an OBIC current fed by electron-hole pairs excited by said light beam due to a photovoltaic effect in said p-n junction; and
   (c) displaying distribution of said OBIC current in said silicon substrate in correspondence to said prescribed scanning,
   said light beam having a wavelength which implements a light penetration depth larger than the thickness of said silicon substrate and which is shorter than the absorption edge of said silicon substrate.

2. An OBIC observation method in accordance with claim 1, wherein said light beam is a YAG ($Y_3Al_5O_{12}$: yttrium aluminum garnet) laser beam of 1064 nm in wavelength.

3. An OBIC observation method in accordance with claim 1, wherein said light beam is an InGaAs (indium gallium arsenide) laser beam of 980 nm in wavelength.

4. An OBIC observation apparatus comprising:
   light emitting means for applying a light beam having a prescribed wavelength;
   light introducing means for introducing said light beam into a silicon substrate, having a first major surface provided with a p-n junction and a second major surface opposite to said first major surface, from the side of said second major surface;
   scanning means for performing prescribed scanning of said light beam with respect to said silicon substrate;
   means for detecting an OBIC current fed by electron-hole pairs excited by said light beam due to a photovoltaic effect in said p-n junction; and
   means for displaying distribution of said OBIC current in said silicon substrate in correspondence to said prescribed scanning.

5. An OBIC observation apparatus in accordance with claim 4, wherein said wavelength attains a greater light penetration depth than the thickness of said silicon substrate and is shorter than the absorption edge of said silicon substrate.

6. An OBIC observation apparatus in accordance with claim 4, wherein said light emitting means is a YAG ($Y_3Al_5O_{12}$: yttrium aluminum garnet) laser oscillator of 1064 nm in wavelength.

7. An OBIC observation apparatus in accordance with claim 4, wherein said light emitting means is an InGaAs (indium gallium arsenide) laser oscillator of 980 nm in wavelength.

8. An OBIC observation method comprising the steps of:
   (a) applying a light beam to a silicon substrate, having a first major surface provided with a p-n junction and a second major surface opposite to said first major surface, from the side of said second major surface while performing prescribed scanning;
   (b) detecting an OBIC current fed by electron-hole pairs excited by said light beam due to a photovoltaic effect in said p-n junction; and
   (c) displaying distribution of said OBIC current in said silicon substrate in correspondence to said prescribed scanning,
   said light beam having a wavelength implementing a light penetration depth larger than the thickness of said silicon substrate.

9. An OBIC observation method in accordance with claim 8, wherein said light beam is a YAG ($Y_3Al_5O_{12}$: yttrium aluminum garnet) laser beam of 1064 nm in wavelength.

10. An OBIC observation method in accordance with claim 8, wherein said light beam is an HeNe (helium neon) laser beam of 1152 nm in wavelength.

11. An OBIC observation apparatus comprising:
   light emitting means for applying a light beam having a prescribed wavelength;
   light introducing means for introducing said light beam into a silicon substrate, having a first major surface provided with a p-n junction and a second major surface opposite to said first major surface, from the side of said second major surface;
   scanning means for performing prescribed scanning of said light beam with respect to said silicon substrate;
   means for detecting an OBIC current fed by electron-hole pairs excited by said light beam due to a photovoltaic effect in said p-n junction; and
   means for displaying distribution of said OBIC current in said silicon substrate in correspondence to said prescribed scanning.

12. An OBIC observation apparatus in accordance with claim 11, wherein said light emitting means is a YAG ($Y_3Al_5O_{12}$: yttrium aluminum garnet) laser oscillator of 1064 nm in wavelength.

13. An OBIC observation apparatus in accordance with claim 11, wherein said light emitting means is an HeNe (helium neon) laser oscillator of 1152 nm in wavelength.

* * * * *